(12) United States Patent
Venant

(10) Patent No.: US 6,169,666 B1
(45) Date of Patent: *Jan. 2, 2001

(54) ELECTROMAGNETIC SHIELDING SCREEN AND CIRCUIT SUPPORT HAVING SUCH A SCREEN

(75) Inventor: Sylvain Venant, Le Mans (FR)

(73) Assignee: U.S. Philips Corporation, New York, NY (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/085,084

(22) Filed: May 26, 1998

(30) Foreign Application Priority Data

May 29, 1997 (FR) .................................. 97 06582

(51) Int. Cl.⁷ ...................................... H05K 9/00
(52) U.S. Cl. ..................... 361/816; 361/800; 174/35 R; 206/719
(58) Field of Search ................... 361/800, 816, 361/818; 174/35 R, 35 GC; 206/719; 268/205.2, 205.3; 224/901.2, 901.6

(56) References Cited

U.S. PATENT DOCUMENTS

| | | | | |
|---|---|---|---|---|
| 4,639,545 | * | 1/1987 | Pithouse et al. | 174/36 |
| 4,837,664 | * | 6/1989 | Rodriguez, II et al. | 361/716 |
| 5,028,739 | * | 7/1991 | Keyser et al. | 174/35 GC |
| 5,256,833 | * | 10/1993 | Schwenk | 174/35 GC |
| 5,524,908 | * | 6/1996 | Reis | 174/35 GC |
| 5,550,713 | * | 8/1996 | Pressler et al. | 361/818 |
| 5,604,668 | | 2/1997 | Wohrstein et al. | 361/816 |

FOREIGN PATENT DOCUMENTS

| | | | |
|---|---|---|---|
| 0594041A1 | 4/1994 | (EP) | H05K 9/00 |
| 07221482 | 8/1995 | (JP) | |

* cited by examiner

Primary Examiner—Jayprakash N. Gandhi

(57) ABSTRACT

A shielding screen for a printed circuit board that supports an electronic circuit has a frame and at least one cover for covering the frame. The frame and the at least one cover, when adhesively fastened to each other, form a subassembly that, when attached to the printed circuit board, electromagnetically shields the electronic circuit. For adhesively fastening the at least one cover to the frame, a conductive adhesive substance is applied to opposite surfaces of the frame and the at least one cover.

8 Claims, 2 Drawing Sheets

ELECTROMAGNETIC SHIELDING SCREEN AND CIRCUIT SUPPORT HAVING SUCH A SCREEN

BACKGROUND OF THE INVENTION

The present invention relates to an electromagnetic shielding screen comprising a frame and at least a cover provided for covering the frame, the frame and the cover at least partly being made of an electrically conductive material and forming a sub-assembly provided for being pressed against the support of the circuit to be shielded. Such a shielding screen is provided for being placed against a printed circuit board or against any other similar support of an electronic circuit, for example, in a portable telephony device.

An example of a cooperation between a printed circuit board and an electromagnetic shielding screen is described in European Patent application EP-A-0 594 041. According to the structure indicated in this document and illustrated in FIG. 1, the shielding screen is formed by a frame 11 and a cover covering this frame, which together form a sub-assembly provided for being pressed against the printed circuit board 12 (or other support of the circuit to be shielded). This sub-assembly is at least partly made of an electrically conductive material so as to realize a kind of Faraday cage for the protection of the circuit. The making of the shielding in two separate parts permits to have access to the protected circuits as required by opening the cover.

The coupling modes habitually found for fastening the cover to the frame are soldering, in which case the coupling is irreversible, or at least implies sufficiently heavy physical handling (unsoldering/resoldering a cover), or also the use of solutions with plates or edges forming a spring and snapping onto the frame. This type of coupling shown, for example, in FIG. 2 is this time easily removable, but the attempts made show that shaking or shocks acting on structures made in this manner often lead to the unwanted opening of the cover.

OBJECTS AND SUMMARY OF THE INVENTION

It is an object of the invention to propose a removable shielding screen whose steadiness with respect to shaking or shocks is much better than that obtained with previous constructions.

For this purpose, the invention relates to an electromagnetic shielding screen as defined in the opening paragraph of the description which is furthermore characterized in that the fastening of the cover to the frame is ensured by the fact that the shape of the cover corresponds to that of the frame and in that the two have a surface lying opposite to the other for fastening them to each other by adhesion with a conductive adhesive substance applied to said two surfaces. The attempts made with this type of structure confirm the mechanical reliability of the proposed solution.

This solution is also applicable when the frame of the shielding screen marks off the boundary of various separate compartments. In that case, each of the compartments for which it is desirable to have access to the circuit protected by the shielding is covered by a cover whose shape corresponds to that of the associated compartment, and each compartment and the associated cover have a surface lying opposite to the other and for fastening them to each other by adhesion. The conductive adhesive is advantageously a substance which, after the cover(s) has (have) been removed, remains adhesive and permits of sticking again and coming off again a great number of times. Obviously, the invention relates to either one of these shielding screen structures, but also to any printed circuit board or any other similar support of an electronic circuit which is arranged for the protection of this circuit and has such a structure.

These and other aspects of the invention will be apparent from and elucidated with reference to the embodiments described hereinafter.

BRIEF DESCRIPTION OF THE PREFERRED EMBODIMENT

Figure 1:
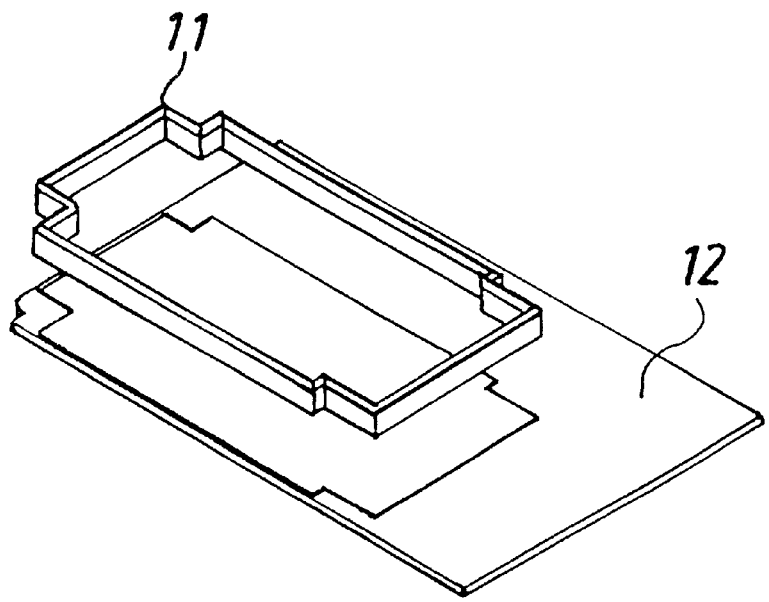
FIG. 1 shows an example of a shielding screen frame according to the state of the art, placed against the board or the support of the circuit to be protected.
Figure 2:
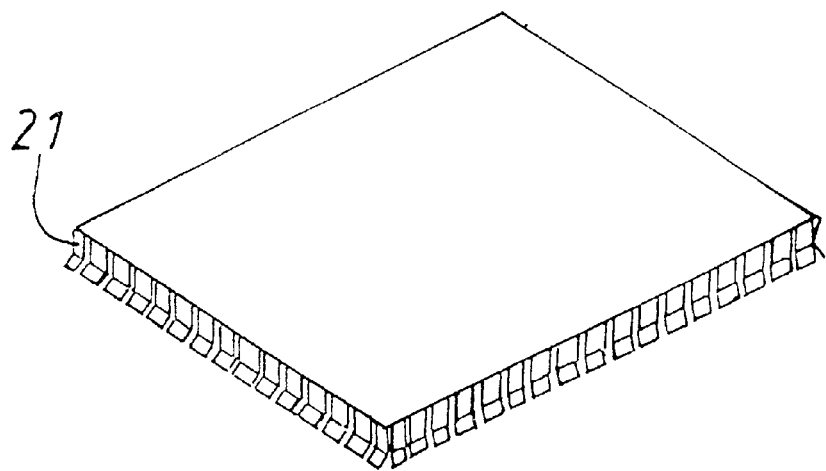
FIG. 2 shows an example of a shielding screen cover according to the state of the art, in which pins permit of the fastening of the cover to the corresponding edges of the frame or compartments thereof.
Figure 3:
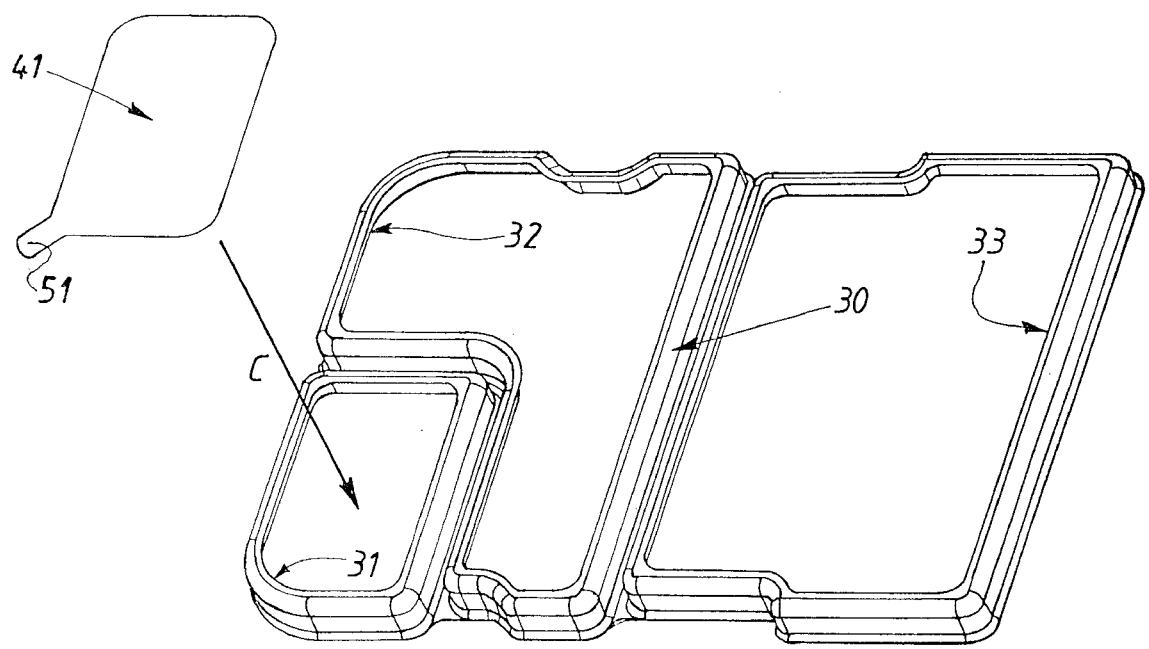
FIG. 3 shows the structure and the coupling mode which, according to the invention, permit of obtaining a better steadiness with respect to shaking or shocks between the frame and its cover(s).

According to the invention, the structure now proposed comprises, as indicated in FIG. 3, a shielding frame 30 open at its top and comprising three compartments 31, 32, 33, in the example shown. This frame 30 is made at least partly of a conductive cast material (magnesium or aluminum), folded or deep-drawing steel, Zamak alloy, . . . ). Covers having corresponding shapes are coupled to the compartments of the frame 30 of which one cover, cover 41 for the compartment 31, is shown. These covers which may be removed to allow access to the marked off area inside the frame 30 are also made at least partly of a conductive material (aluminum foil, carton covered by a metallic coating . . . ).

The coupling of the frame and of the covers (of the cover when the frame marks off only a single and unique compartment) forms, as observed previously, a Faraday cage for the printed circuit board or the circuit support, but the opening of the or of one of the covers of this cage may now be made without compromising the mechanical steadiness of the assembly of frame and cover(s). Indeed, each compartment of the frame is marked off by a flat surface, a kind of strip following the contour of said compartment. The associated cover, having a corresponding shape, is flat and the rim of its surface forms a kind of strip provided for coming opposite to the corresponding surface of the strip that follows the contour of the compartment.

The application of a glue or of an adhesive between these two opposite surfaces then permits of fastening these two elements (frame and cover(s)) to each other, which are thus very firmly immobilized whatever the shocks or shaking to which subsequently the assembly of frame/cover(s)/circuit support could be subjected. Each cover comprises, as appropriate, a tab, 51 in the case of the cover 41, to facilitate the opening of the cover. The adhesive is a substance which, after the cover has been detached (the manner in which a bottle of yoghurt is opened), permits of sticking it on again and this a considerable number of times without this substance losing its adhesive effect. The use of a simple glue can, however, also be suitable but can, for gluing the cover back on again, proceed to a new application of glue.

Obviously, the adhesive and the glue, whatever the solution chosen, are conductors (charged with conducting particles, gold or copper, for example . . . ) so as to preserve the electrical contact and the Faraday cage thus formed.

What is claimed is:

1. An electromagnetic shielding screen for a printed circuit board supporting an electronic circuit, said shielding screen comprising:

a frame and at least one cover for covering the frame, the frame and the at least one cover at least partly being made of an electrically conductive material and forming a sub-assembly for attachment to the printed circuit board so as to electromagnetically shield the electronic circuit, a shape of the at least one cover corresponding to a shape of the frame, and the frame and the at least one cover having opposite surfaces for fastening the at least one cover to the frame by adhesion with a conductive adhesive substance applied to said surfaces, the conductive adhesive substance being a substance which remains adhesive after the at least one cover is detached from and re-attached to the frame a plurality of times.

2. A shielding screen as claimed in claim 1, in which the frame marks off compartments, at least one of the compartments being covered by a cover whose shape corresponds to a shape of a compartment that is associated with the cover.

3. A shielding screen as claimed in claim 2, wherein each cover is at least partly made of an aluminum foil.

4. A printed circuit board with an electromagnetic shielding screen for shielding an electronic circuit supported by said printed circuit board, said shielding screen comprising:

a frame and at least one cover for covering the frame, the frame and the at least one cover at least partly being made of an electrically conductive material and forming a sub-assembly for attachment to the printed circuit board so as to electromagnetically shield the electronic circuit, a shape of the at least one cover corresponding to a shape of the frame, and the frame and the at least one cover having opposite surfaces for fastening the at least one cover to the frame by adhesion with a conductive adhesive substance applied to said surfaces, the conductive adhesive substance being a substance which remains adhesive after the at least one cover is detached from and re-attached to the frame a plurality of times.

5. An electromagnetic shielding screen for a printed circuit board supporting an electronic circuit, said shielding screen comprising:

a frame and at least one cover for covering the frame, the frame and the at least one cover at least partly being made of an electrically conductive material and forming a sub-assembly for attachment to the printed circuit board so as to electromagnetically shield the electronic circuit, a shape of the at least one cover corresponding to a shape of the frame, and the frame and the at least one cover having opposite surfaces for fastening the at least one cover to the frame by adhesion with a conductive adhesive substance applied to said surfaces, the conductive adhesive substance being a substance that permits the at least one cover of sticking again on the frame after the at least one cover has been detached from the frame.

6. A printed circuit board with an electromagnetic shielding screen for shielding an electronic circuit supported by said printed circuit board, said shielding screen comprising:

a frame and at least one cover for covering the frame, the frame and the at least one cover at least partly being made of an electrically conductive material and forming a sub-assembly for attachment to the printed circuit board so as to electromagnetically shield the electronic circuit, a shape of the at least one cover corresponding to a shape of the frame, and the frame and the at least one cover having opposite surfaces for fastening the at least one cover to the frame by adhesion with a conductive adhesive substance applied to said surfaces, the conductive adhesive substance being a substance that permits the at least one cover of sticking again on the frame after the at least one cover has been detached from the frame.

7. An electromagnetic shielding screen for a printed circuit board supporting an electronic circuit, said shielding screen comprising:

a frame and at least one cover for covering the frame, the frame and the at least one cover at least partly being made of an electrically conductive material and forming a sub-assembly for attachment to the printed circuit board so as to electromagnetically shield the electronic circuit, a shape of the at least one cover corresponding to a shape of the frame, and the frame and the at least one cover having opposite surfaces for fastening the at least one cover to the frame by adhesion with a conductive adhesive substance applied to said surfaces, after detaching the at least one cover from the frame, the conductive adhesive substance being newly applied to said surfaces and the at least one cover being re-attached to the frame.

8. A printed circuit board with an electromagnetic shielding screen for shielding an electronic circuit supported by said printed circuit board, said shielding screen comprising:

a frame and at least one cover for covering the frame, the frame and the at least one cover at least partly being made of an electrically conductive material and forming a sub-assembly for attachment to the printed circuit board so as to electromagnetically shield the electronic circuit, a shape of the at least one cover corresponding to a shape of the frame, and the frame and the at least one cover having opposite surfaces for fastening the at least one cover to the frame by adhesion with a conductive adhesive substance applied to said surfaces, after detaching the at least one cover from the frame, the conductive adhesive substance being newly applied to said surfaces and the at least one cover being re-attached to the frame.

\* \* \* \* \*